United States Patent [19]

Aton et al.

[11] Patent Number: 5,059,897

[45] Date of Patent: Oct. 22, 1991

[54] METHOD AND APPARATUS FOR TESTING PASSIVE SUBSTRATES FOR INTEGRATED CIRCUIT MOUNTING

[75] Inventors: Thomas J. Aton, Dallas; Satwinder Malhi; Masashi Hashimoto, both of Garland, all of Tex.; Shivaling S. Mahant-Shitti, Bangalore, India; Oh-Kyong Kwon, Richardson, Tex.; Thirumalai Sridhar, Huston, N.H.

[73] Assignee: Texas Instruments Incorporated, Dallas, Tex.

[21] Appl. No.: 447,328

[22] Filed: Dec. 7, 1989

[51] Int. Cl.$^5$ .............................................. G01R 31/02
[52] U.S. Cl. ............................ 324/158 R; 324/158 T; 324/512; 324/537
[58] Field of Search ....................... 324/73.1, 512, 522, 324/523, 537, 158 R, 158 D, 158 T; 357/14

[56] References Cited

U.S. PATENT DOCUMENTS

| | | | |
|---|---|---|---|
| 3,619,735 | 11/1971 | Chen et al. | 357/14 |
| 3,639,814 | 2/1972 | Engbert | 357/14 |
| 3,772,097 | 11/1973 | Davis | 357/14 |
| 3,801,910 | 4/1974 | Quinn | 324/158 R |
| 4,053,833 | 10/1977 | Malmberg et al. | 324/158 R |
| 4,144,493 | 3/1979 | Lee et al. | 324/158 R |
| 4,342,959 | 8/1982 | Skilling | 324/537 |
| 4,386,459 | 6/1983 | Boulin | 324/158 R |
| 4,459,693 | 7/1984 | Prang et al. | 324/73.1 |
| 4,479,088 | 10/1984 | Stopper | 324/537 |
| 4,516,071 | 5/1985 | Buehler | 324/158 R |
| 4,707,654 | 11/1987 | Suzuki et al. | 324/158 R |
| 4,719,418 | 1/1988 | Flaker et al. | 324/73.1 |
| 4,779,041 | 10/1988 | Williamson, Jr. | 324/537 |
| 4,812,742 | 3/1989 | Abel et al. | 324/537 |
| 4,894,605 | 1/1990 | Ringleb et al. | 324/158 R |
| 4,896,108 | 1/1990 | Lynch et al. | 324/73.1 |
| 4,906,921 | 3/1990 | Juge | 324/158 D |

Primary Examiner—Kenneth A. Wieder
Assistant Examiner—William J. Burns
Attorney, Agent, or Firm—James C. Kesterson; James T. Comfort; Melvin Sharp

[57] ABSTRACT

A system and method for testing the continuity of interconnecting nets on a substrate to be used in multi-chip technology is provided. The system includes coupling a test pad (15) to the net (12) to be tested. The test pad (15) is coupled through a diode (34) to a common node (32). The voltage of a first node (16) of the net (12) is sensed by a voltmeter (38) which is coupled to ground. A predetermined current signal is applied to each node (16, 18, 20, 22) in the net through the use of a probe (42). The voltage of the remaining nets (14) is sensed by a voltmeter (44). If an erroneous interconnection (31) is present between the net (12) to be tested and any other net (14) on the substrate, the voltage of the other net (14) will fluctuate. The voltmeter (38) will indicate if there is an electrical connection between the node (16) and the test pad (15) during testing. If an electrical path is established between each node in the net (12) and test pad (15), the continuity of the net (12) is established through the operation of Ohm's law.

31 Claims, 2 Drawing Sheets

METHOD AND APPARATUS FOR TESTING PASSIVE SUBSTRATES FOR INTEGRATED CIRCUIT MOUNTING

TECHNICAL FIELD OF THE INVENTION

This invention relates in general to the field of integrated electronic devices. More particularly, the present invention relates to a system and method by which interconnecting nets on a substrate may be tested prior to chip assembly.

BACKGROUND OF THE INVENTION

Traditionally, integrated circuits are formed on semiconductor chips. In order to interconnect these chips with other components of an integrated electronic device, the chips are wire bonded into a package which includes a number of signal pins. The package is then bonded onto a printed circuit board (PC board). The pins on each of the packages are connected using strips of metal bonded to the surface of the PC board which is typically formed of a sheet of fiberglass or similar insulating material.

Packages for chips degrade intrinsic chip performance and add cost and space. Alternatively, bare chips may be bonded on top of a piece of silicon bearing an interconnect system directly, either with flip-chip or wirebond technology. The interconnects between chips are formed in this semiconductor substrate using conventional photolithographic techniques. In addition, multiple layers of interconnects can be formed on the substrate using standard semiconductor processing techniques. The interconnecting nets are coupled to the chips through either small bumps of solder, or wire bond pads which are referred to as nodes. The chips to be bonded to the substrate have corresponding nodes on their surface. The chips to be bonded may then be "flipped" or wire bonded onto the substrate and the corresponding nodes are bonded together. This allows for greater device density because of the smaller geometries possible using semiconductor process techniques to form the interconnects.

In order to get good assembly yield it is extremely important to determine if the interconnecting nets have been properly formed in the substrate prior to bonding. The interconnecting nets must be tested to ensure continuity between each of the nodes in the net. Each of the nets must also be tested for erroneous connections to other nets.

Traditional PC boards are tested using bed-of-nails testers. This method of testing is impractical for silicon-on-silicon multi-chip technology because of the extremely small geometries involved. It is physically impossible to build a bed-of-nails tester which is capable of testing the thousands of points in the interconnecting nets spaced microns apart.

Accordingly, a need has arisen for a system and method for testing the interconnecting nets formed in the substrates prior to the bonding of the chips on the substrates. The method and system must test for continuity within the nets as well as for erroneous connections between the nets.

SUMMARY OF THE INVENTION

In accordance with the present invention, a method and system is provided which allows for the testing of interconnecting nets formed in passive substrates used in multi-chip technology.

More specifically, the present invention provides a method by which the electrical continuity between nodes in the net may be tested and, at the same time, the net may be tested for erroneous connections with other nets on the substrate.

According to one embodiment of the present invention, each of the nets is coupled through a diode to a common node. The common node is coupled to a predetermined voltage level. A probe coupled to a current source and a voltage sensing device is applied to each node in the net. In this manner, the voltage sensing device can test for continuity within the net. In addition, sensing circuitry coupled to the remaining nets can simultaneously test for erroneous connections between interconnecting nets.

According to another embodiment of the present invention, the diodes used for the testing of the interconnecting nets are formed in the substrate itself. Wells of a conductivity type different than the substrate conductivity type are formed adjoining each of the test pads connected to the interconnecting nets.

According to still another embodiment of the present invention, the diode associated with the power supply nets and nodes is constructed as a large area diode in the substrate surface. This allows for testing of the power supply net as discussed previously, and also includes the important technical advantage of increasing the conductance between the nodes in the power supply net through the inherent conductance of the implanted region. In addition, the inherent capacitance of the large area diode helps to buffer the power supply net and also functions as a decoupling capacitor to help dampen noise from the power supply signal. This added conductance and capacitance is inherent in the test circuit and thus assists the circuit designer by providing additional conductance paths (for example, for ground currents) and sources of buffering capacitance for the integrated circuit chips mounted on the substrate.

BRIEF DESCRIPTION OF THE DRAWINGS

A more complete understanding of the present invention may be acquired by referring to the Detailed Description and Claims when considered in connection with the accompanying drawings, wherein:

DETAILED DESCRIPTION OF THE INVENTION

Figure 1:
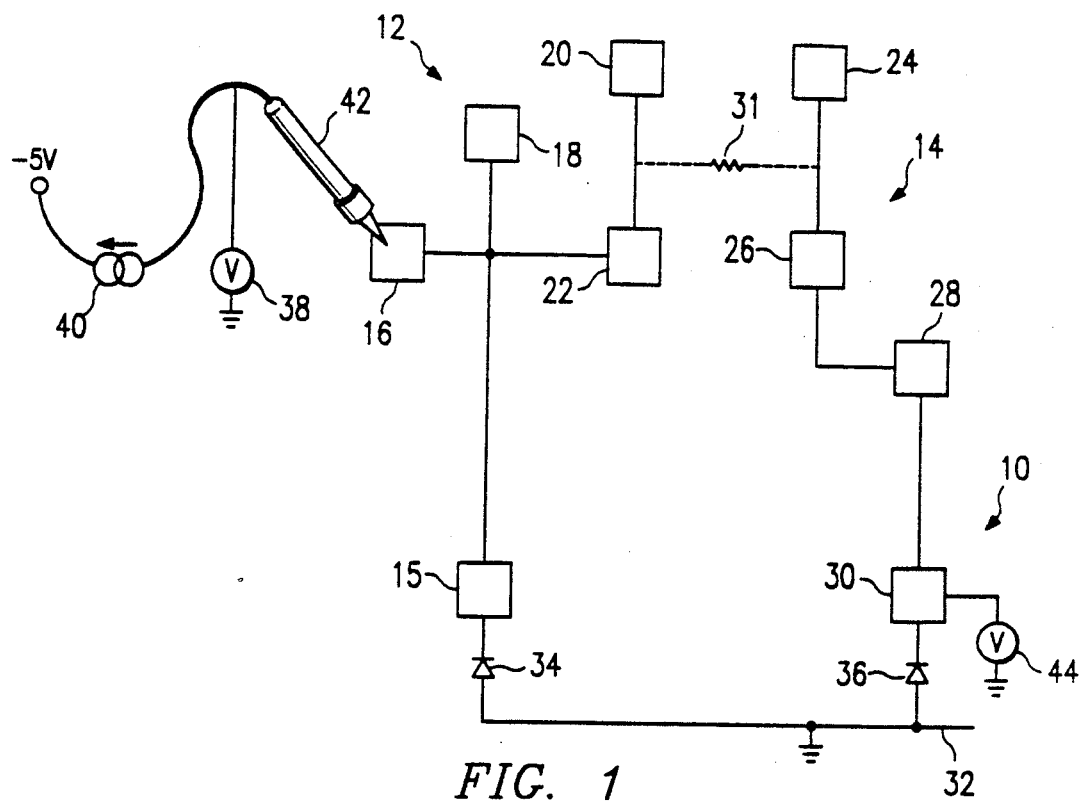
FIG. 1 is a, schematic drawing illustrating the system and method for testing the interconnecting nets according to the present invention.

Referring to FIG. 1, a circuit is indicated generally at 10 which demonstrates important technical advantages of the method and system used to test interconnecting nets. Circuit 10 comprises a first interconnecting net indicated generally at 12 and a second interconnecting net indicated generally at 14. Interconnecting nets 12 and 14 are representative of a large number of nets which would form an integrated circuit interconnecting device. Interconnecting nets 12 and 14 may be formed, for example, on a semiconductor substrate using photolithographic methods. Through the use of these techniques the conduction paths connecting the various chips to be assembled in a multi-chip module on a substrate may be spaced hundreds of times closer together than is possible using conventional printed circuit-boards. The term "net" as used herein should be understood to include any type of interconnecting conduction path intended to be used to connect integrated circuit chips whatever techniques may be used to form these nets. The testing methods and systems of the present invention are applicable to any interconnecting net however formed. Moreover, the inclusion of only nets 12 and 14 in circuit 10 is a simplification presented solely for the purposes of teaching the present invention, and it should be understood that an actual substrate used in the multi-chip technology could contain hundreds or even thousands of interconnecting nets. However, the operation of circuit 10 is independent of the number of interconnecting nets.

Net 12 comprises a test pad 15 which is coupled to a series of nodes 16, 18, 20 and 22. Nodes 16 through 22 represent the points at which an integrated circuit chip would be bonded to the substrate. The purpose of the net 12 is to electrically connect nodes 16 through 22. Test pad 15 is not essential to the operation of the entire integrated circuit, but is included to test the continuity of the interconnecting nets according to the method of the present invention. According to one embodiment of the present invention, test pad 15 is positioned at the periphery of the substrate or in a specific location on the substrate such that the testing of the substrate may be accomplished using conventional probe cards or standardized probe assemblies. It is desirable to the method of the present invention that each net formed on the substrate be coupled in a similar manner as nets 12 and 14 such that as each net is tested for continuity within the net, it can also be tested for erroneous connections with all remaining nets on the substrate as will be described herein.

For the purposes of teaching the present invention, the net 14 is shown comprising nodes 24, 26 and 28 and test pad 30. A resistor 31 is included to symbolize a possible erroneous connection between net 14 and net 12.

Test pads 15 and 30 are each coupled to a common node 32 through respective diodes 34 and 36. The common node 32 is coupled to ground. A probe 42 is coupled to a current source 40 and a voltmeter 38. The current source 40 used to apply a predetermined current level to each of the nodes within the net to be tested and is coupled to a maximum negative voltage of −5 volts. Voltmeter 38 is coupled between the probe 42 and ground.

Net 12 is tested by touching each of the nodes 16, 18, 20 and 22 with the probe 42. For example, when probe 42 is touched to node 16, the voltmeter 38 senses voltage level of probe 42. If there is a continuous electrical path between test pad 15 and the probe 42, voltmeter 38 will read approximately −1 volt which is equal to the ground potential minus the voltage drop across diode 34. If there is a discontinuity between test pad 15 and the probe 42, voltmeter 38 will read −5 volts as current source 40 appears as a short. As each of nodes 18, 20 and 22 is similarly tested, a respective continuous electrical path is established between the tested node and the test pad 15. If a continuous electrical path is established between each of nodes 16, 18, 20 and 22 of net 12 and test pad 15, it is also established through the operation of Ohm's law that there is a continuous electrical path between each of the nodes in the net 12.

Simultaneously with the testing for continuity between the nodes of net 12, net 12 may also be tested for erroneous connections with all the remaining nets on the substrate. Referring again to FIG. 1, if an erroneous connection path, represented by resistor 31, is present coupling nets 12 and 14, a representative voltmeter 44 coupled to net 14 at test pad 30 will sense a change in the voltage of test pad 30 when probe 42 is touched to any of the nodes in net 12. This is due to the fact that, because of the connection formed by resistor 31, current will be drawn through diode 36 into net 14 through resistor 31 into net 12 through probe 42 to the −5 v voltage level. The current drawn through this current path will pull down the voltage of the test pad 30. This drop in voltage level can be sensed by voltmeter 44. If voltmeter 44 indicates a fluctuation in the voltage of test pad 30, the substrate has an erroneous connection between two of the interconnecting nets and the substrate can be discarded prior to the chip bonding procedure. It should be understood that net 14 and test pad 30 associated with it are merely representative of the remaining nets on the substrate. The voltage of each of the remaining test pad must be monitored during the testing of the continuity of each net. The test pads could be monitored individually if it is necessary to determine which net is shorted to the net being tested or the remaining test pads could be monitored collectively to accomplish a simpler test merely testing for zero faults.

The construction of net 14 differs from the construction of net 12 in one important aspect. Net 12 incorporates a branch point within the net between nodes 16, 18 and 22. On the other hand, net 14 is constructed as a "daisy chain" with no branch points. If it is practical from a circuit design standpoint to construct all of the nets on a substrate in a daisy-chain fashion, testing of the substrate is greatly simplified. The placement of the probe 42 on node 24 simultaneously tests the entire net 14 for continuity within the net 14. Additionally, if node 24 were itself a test pad disposed on the outer edge or in a specified predetermined location on the substrate, there would be no need for a movable probe 42 to test net 14. A conventional probe card could contact both test pad 30 and test pad/node 24. Once again, this would greatly simplify testing procedures through the use of a simple probe card to contact both test pads 30 and 24. However, this method imposes significant circuit design restrictions on the layout of the interconnecting nets as each net requires connection to two test pads disposed on the periphery of the substrate or in some standard location on the substrate.

Figure 2:
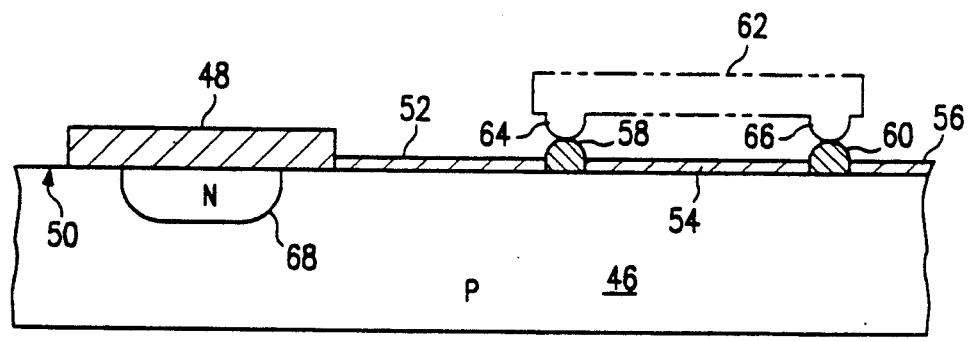
FIG. 2 is a greatly enlarged cross sectional elevational diagram of a bonded chip and substrate illustrating the construction of the diodes used in the testing procedure according to the present invention.

FIG. 2 illustrates a method by which the diodes illustrated by diodes 34 and 36 may be constructed if the substrate upon which the interconnecting nets are formed comprises a semiconductor material. Referring to FIG. 2, a (p) type substrate 46 is shown. A test pad 48 is shown formed on an upper surface 50 of substrate 46. Interconnecting lines which form an interconnecting net are shown at 52, 54 and 56. Two nodes are shown at 58 and 60. For purposes of explanation, an integrated circuit chip 62 is shown with connecting nodes 64 and 66 in phantom as it would be situated following the chip bonding process. Chip 62 is shown solely for the purposes of explanation of the multi-chip technology. It should be understood that the testing of the continuity of the nets constructed on substrate 46 would occur prior to the bonding of chip 62 to the substrate 46.

The diode necessary for the operation of circuit 10 shown in FIG. 1 is shown in FIG. 2 to be constructed using an n-well 68 which can be implanted into the upper surface 50 of substrate 46. This process creates a p-n junction between the substrate 46 and the n-well 68 creating the necessary diode connection. The substrate 46 serves as the common node 32 shown in FIG. 1. To accomplish the testing procedure discussed previously, a voltmeter would be coupled between the substrate 46 and the probe. The probe would also be coupled to the above described current source and touched to nodes 58 and 60. This procedure would establish the continuity of the net being tested as well as the isolation of that net from remaining nets formed on substrate 46 if the remaining nets were monitored as described above.

The formation of n-well 68 may be accomplished through conventional implantation techniques. It may be formed to be of any size and depth depending upon the particular circuit and testing application.

Figure 3:
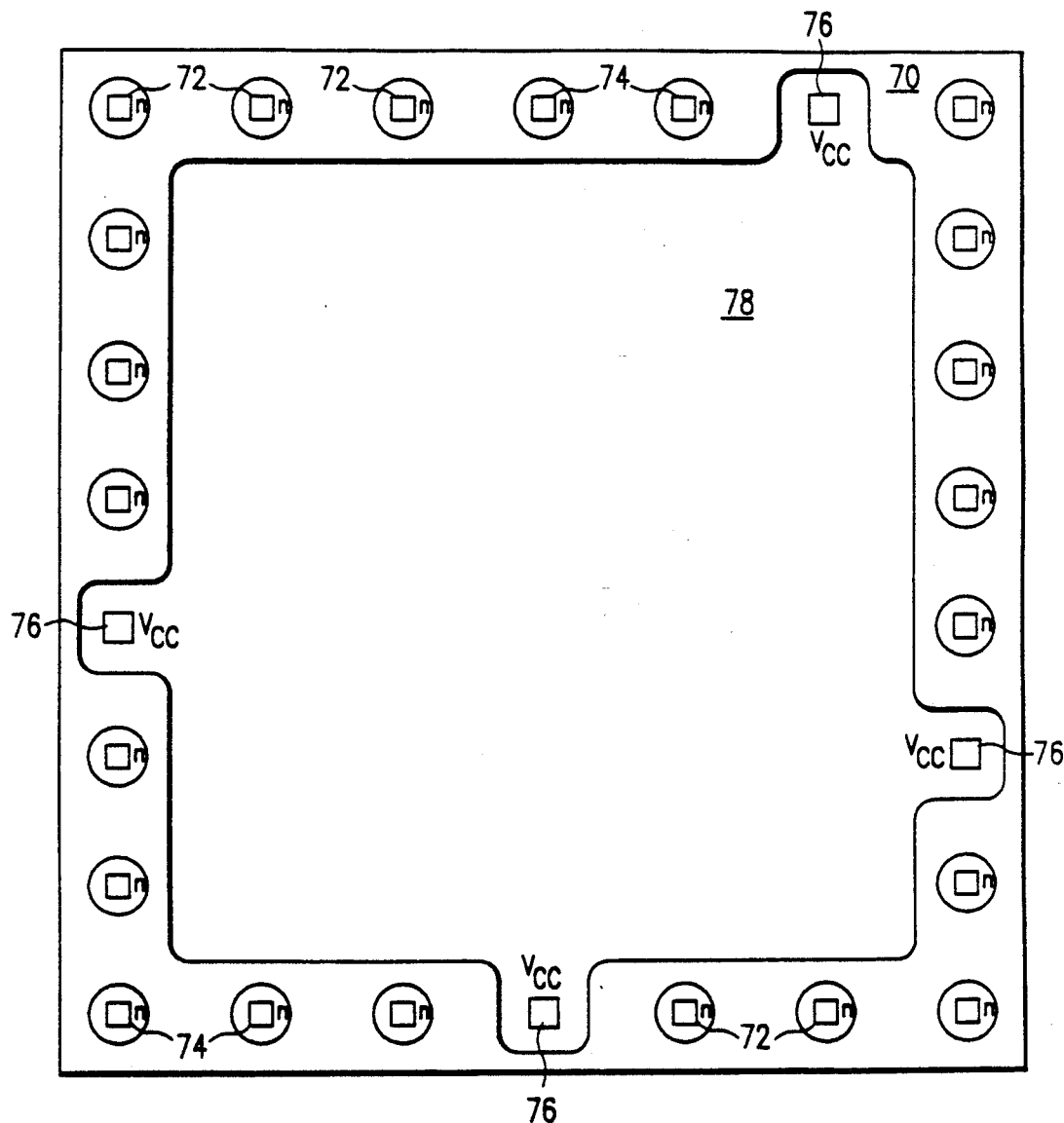
FIG. 3 is a greatly enlarged plan view of a substrate illustrating the layout of individual diodes and a giant area diode constructed according to the present invention.

Still another embodiment of the present invention is illustrated in FIG. 3. FIG. 3 shows a greatly enlarged plan view of a substrate 70 upon which interconnecting nets may be formed. Substrate 70 has a plurality of test pads 72 formed on its periphery. Coupled to each test pad 72 is an n-well 74 constructed according to the method discussed in relation to FIG. 2. The test pads 76 are labeled VCC indicating that they are power supply test pads. The power supply test pads 76 are formed adjoining a large n-well 78. N-well 78 forms a large area diode through its contact with the p-type substrate 70.

This large area diode allows for the testing of the power supply net as discussed previously. In addition, the use of a single large n-well 78 as opposed to four individual n-wells for the power supply test pads 76 creates two important technical advantages. First, the n-well 78 serves as an alternate conduction path between various portions of the power supply net. This creates greater current carrying capacity for the power supply net without increasing the size of the interconnects of the power supply net. Secondly, the diode created by n-well 78 and the p-substrate 70 has inherent capacitance. This capacitance can be used to buffer the power supply net. The discharge of the charge stored in the large area diode helps to supply the charge required during periods of peak current draw by the integrated circuit formed on the substrate 70. Because of this inheritant capacitance built in to the testing apparatus, a circuit designer may use smaller capacitors to buffer the power supply net. In addition, the inheritance capacitance of the large area diode may be used as a decoupling capacitor to help filter noise from the power supply net. Similar large area diodes could be used for similarly coupling nets which carry other signals common to each of the nets.

In summary, a system and method are provided which enable the testing of the interconnecting nets formed on a substrate prior to the bonding of integrated circuit chips on the substrate. The system provided allows for the simultaneous testing of the continuity within the nets and the isolation of the net being tested from the remaining nets formed on the substrate. According to one embodiment of the present invention, if the substrate comprises a semiconductor material, the diodes included in the circuit may be efficiently formed in the surface of the substrate itself. Additionally, particular nets, such as the power supply net, which are coupled to a common signal source may use a common large area diode for testing purposes. The large area diode also provides an additional conductance path and buffering and decoupling capacitance.

Although the present invention has been described in detail, it should be understood that various changes, substitutions and alterations can be made thereto without departing from the spirit and scope of the invention as defined by the appended claims.

What is claimed is:

1. A circuit for testing the continuity between conductive nodes connected in a plurality of interconnecting nets in an integrated circuit interconnecting device, comprising:
   first and second test points coupled to a plurality of conductive nodes in respective first and second interconnecting nets;
   a common conductive node;
   first and second diodes couples respectively between said common node and said first and second test points;
   circuitry for applying a predetermined signal to one of said nodes in said first interconnecting net;
   circuitry for detecting a voltage of said one of said nodes in said first net responsive to the application of said predetermined signal, said voltage indicative of the electrical continuity between said nodes in said first net; and
   circuitry for detecting a change in the voltage of said second test point responsive to the application of said predetermined signal, said change in voltage indicative of erroneous electrical continuity between said first and second nets.

2. The circuit of claim 1, and further comprising:
   a plurality of test points each respectively coupled to other of the nets;
   a plurality of diodes each respectively coupled between said common node and one of said plurality of test points.

3. The circuit of claim 1, wherein the integrated circuit interconnecting device is formed on a semiconductor substrate of a predetermined conductivity type, said common node comprising said substrate, said diodes comprising regions formed adjoining said test points in said substrate and formed to be of a conductivity type different than said predetermined conductivity type.

4. The circuit of claim 3, and further comprising:
   a common diode comprising a common region formed in said substrate to be of said different conductivity type and formed adjoining a selected plurality of nets, said selected nets intended to carry a common electrical signal.

5. The circuit of claim 4 wherein said intended common electrical signal comprises a power supply voltage signal, said common region comprising an alternate conduction path for the propagation of said power supply voltage signal, said common diode supplying capacitance operable to buffer said power supply voltage signal.

6. The circuit of claim 1, and further comprising:
   a common diode coupled between a selected plurality of nets and said common node, said selected nets intended to carry a common electrical signal.

7. The circuit of claim 6, wherein said intended common electrical signal comprises a power supply voltage signal, said common diode comprising an alternate conduction path for the propagation of said power supply signal and supplying capacitance operable to buffer said power supply voltage signal.

8. A circuit for testing the continuity between nodes in a plurality of nets in an integrated circuit interconnecting device, comprising:
   a common node;
   a first diode having a cathode and an anode, said cathode of said first diode coupled to a first point in a first net, said anode of said first diode coupled to said common node;
   a second diode having a cathode and an anode, said cathode of said second diode coupled to a second net, said anode of said second diode coupled to said common node;
   circuitry for applying a predetermined electrical signal level to a second point in said first net;
   voltage sensing circuitry coupled between said second point in said first net and said common node, said voltage sensing circuitry operable to sense a voltage level of said second point, said voltage level of said second point indicative of the electrical continuity between said first and second points; and
   voltage sensing circuitry coupled to said second net, changes in the voltage level of said second net indicative of erroneous electrical continuity between said first and second nets.

9. The circuit of claim 8, and further comprising:
   at least one other diode, each having an anode and a cathode, each of said anodes coupled to said common node and each of said cathodes coupled respectively to at least one of the nets.

10. The circuit of claim 8, wherein the device is formed on a semiconductor substrate of a predetermined conductivity type, said common node comprising said substrate, said diodes comprising regions formed in said semiconductor substrate to be of a conductivity type different than said predetermined conductivity type.

11. The circuit of claim 8, wherein each of the nets is coupled to said common node through at least one of said diodes.

12. The circuit of claim 8, and further comprising:
   a common diode coupled between a selected plurality of nets and said common node, said selected nets intended to carry a common electrical signal.

13. The circuit of claim 12, wherein said intended common electrical signal comprises a power supply voltage signal, said common diode comprising an alternate conduction path for the propagation of said power supply signal and supplying capacitance operable to buffer said power supply voltage signal.

14. A circuit for testing the continuity between conductive nodes connected in a plurality of interconnecting nets in an integrated circuit interconnecting device formed on a semiconductor substrate of a predetermined conductivity type comprising:
   first and second test pads coupled to a plurality of conductive nodes in respective first and second interconnecting nets;
   first and second regions of a conductivity type different than said predetermined conductivity type formed in the substrate adjoining said first and second test pads, respectively;
   circuitry for applying a predetermined signal to one of said nodes in said first interconnecting net;
   circuitry for detecting a voltage of said one of said nodes in said first net responsive to the application of said predetermined signal, said voltage indicative of the electrical continuity between said nodes in said first net; and
   circuitry for detecting a change in the voltage of said second test pad responsive to the application of said predetermined signal, said change in voltage indicative of erroneous electrical continuity between said first and second nets.

15. The circuit of claim 14, and further comprising:
   at least one other test pad, said other test pads adjoining regions formed in said substrate to be of said conductivity type different than said predetermined conductivity type and each of said regions formed adjoining at least one of the nets.

16. The circuit of claim 14, and further comprising:
   a plurality of other test pads and a third region of said conductivity type different than said predetermined conductivity type formed in the substrate adjoining said plurality of said test pads each coupled to a respective net.

17. The circuit of claim 16, wherein said plurality of said test pads are coupled to nets intended to carry the same signal.

18. The circuit of claim 17, wherein said signal comprises a power supply voltage signal.

19. The circuit of claim 14, wherein said predetermined conductivity type is (p) type and wherein said conductivity type different than said predetermined conductivity type is (n) type.

20. The circuit of claim 14 wherein said predetermined conductivity type is (n) type and wherein said conductivity type different than said predetermined conductivity type is (p) type.

21. A method for testing the continuity between conductive nodes in a plurality of interconnecting nets in an integrated circuit interconnecting device, comprising the steps of:
   forming a first diode coupled between a test point in a first net and a common conductive node;
   forming a plurality of diodes each respectively coupled between at least one net and the common node;
   applying a predetermined signal to a first node in the first net;
   sensing a voltage of said first node responsive to said step of applying a predetermined signal, the voltage level of the first node indicating the electrical continuity between the first node and the test point; and
   sensing a change in the voltage level of the remaining nets responsive to said step of applying a predetermined signal, changes in the voltage level of the remaining nets indicating erroneous electrical continuity between the first net and another of the nets.

22. The method of claim 21, and further comprising the steps of:
   applying a predetermined signal to a second node in the first net; and
   sensing a voltage level of the second node responsive to said step of applying a predetermined signal to the second node, the voltage level of the second node indicative of the electrical continuity between the test point and the second node and consequently indicating the electrical continuity between the first and second nodes.

23. The method of claim 21, and further comprising the steps of:

applying a predetermined signal to at least one node in each of the nets, sequentially;

sensing a voltage of each of the one node in each of the nets respectively as the predetermined signal is applied to at least one node in each net; and sensing a change in the voltage level of the remaining nets responsive to said step of applying a predetermined signal to at least one node in each of the nets, sequentially.

24. A method for testing the continuity between nodes in a plurality of interconnecting nets in an integrated circuit interconnecting device, the device formed in a semiconductor substrate of a predetermined conductivity type, each of the nets comprising at least one test pad coupled to the net, the method comprising the steps of:

forming a first region of a conductivity type different than said predetermined conductivity type in the substrate formed adjoining and electrically coupled to a test pad of a first net;

forming a plurality of regions of said conductivity type different than said predetermined conductivity type in the substrate, each of the regions formed adjoining and electrically coupled to at least one of the other nets;

applying a predetermined signal to a first conductive node in the first net remote from the test pad of the first net; and sensing a voltage of the first node responsive to said step of applying a predetermined signal, the voltage level of the first node indicative of the electrical continuity between the first node and the test pad of the first net.

25. The method of claim 24, and further comprising the steps of:

applying the predetermined signal to a second node in the first net remote from the first node and the test pad of the first net;

sensing a voltage of the second node responsive to said step of applying the predetermined signal to a second node in the first net, the voltage level of the second node indicative of the electrical continuity between the second node and the test pad of the first net and, consequently, indicative of the electrical continuity between the first and second nodes in the first net.

26. The method of claim 24, and further comprising the step of:

sensing a change in the voltage level of the remaining nets responsive to said step of applying a predetermined signal, changes in the voltage level of the remaining nets indicating an erroneous electrical continuity between the first net and one of the remaining nets.

27. The method of claim 24, wherein the first node comprises the opposite end of the net, the first net constructed such that it contains no branch points and has two ends, the test pad of the first net resident at one end and the first node resident at the other end.

28. The method of claim 27, wherein said first node comprises a second test pad of said first net.

29. The method of claim 24, and further comprising the step of:

forming a common region of the conductivity type different than said predetermined conductivity type adjoining a plurality of selected test pads, the selected test pads coupled to individual nets intended to carry a common electrical signal.

30. The method of claim 29 wherein the intended common electrical signal comprises a power supply voltage signal, the common region forming an alternate conduction path for the propagation of the power supply voltage signal, the interface common region with the substrate supplying capacitance operable to buffer the power supply voltage signal.

31. The circuit of claim 16, wherein said first, second and third regions of said conductivity type different than said predetermined conductivity type are adjoined.

* * * * *